(12) United States Patent
Lee

(10) Patent No.: US 6,561,411 B2
(45) Date of Patent: May 13, 2003

(54) WIRE BONDING PROCESS AND WIRE BOND STRUCTURE

(75) Inventor: Chun-Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 26 days.

(21) Appl. No.: 09/900,066

(22) Filed: Jul. 6, 2001

(65) Prior Publication Data
US 2002/0079354 A1 Jun. 27, 2002

(30) Foreign Application Priority Data
Dec. 22, 2000 (TW) .......................................... 89127630

(51) Int. Cl.[7] .......................... B23K 31/00; B23K 1/06; H01L 23/495; H01L 21/44
(52) U.S. Cl. ..................... 228/180.5; 228/1.1; 257/673; 438/613
(58) Field of Search .......................... 228/180.5, 110.1, 228/1.1; 438/613; 257/673

(56) References Cited

U.S. PATENT DOCUMENTS

| | | | | | |
|---|---|---|---|---|---|
| 5,328,079 | A | * | 7/1994 | Mathew et al. | 228/180.5 |
| 5,740,956 | A | * | 4/1998 | Seo et al. | 228/180.22 |
| 5,908,317 | A | * | 6/1999 | Heo | 228/180.22 |
| 6,181,569 | B1 | * | 1/2001 | Chakravorty | 228/122.1 |
| 6,239,366 | B1 | * | 5/2001 | Hsuan et al. | 174/52.3 |
| 6,396,155 | B1 | * | 5/2002 | Nukiwa et al. | 257/778 |
| 6,420,256 | B1 | * | 7/2002 | Ball | 438/123 |
| 2002/0014685 | A1 | * | 2/2002 | Tsukahara | 257/673 |
| 2002/0105069 | A1 | * | 8/2002 | Kawahara et al. | 257/690 |

* cited by examiner

Primary Examiner—M. Alexandra Elve
Assistant Examiner—Zidia Pittman
(74) Attorney, Agent, or Firm—J.C. Patents

(57) ABSTRACT

In a wire-bonding process, a chip is provided with at least a first contact pad. A chip carrier is further provided with at least a second contact pad. A plurality of stacked conductive bumps are formed on the first contact pad. A conductive wire is formed by a reverse bonding process. The conductive wire electrically connects the second contact pad of the chip carrier to the stacked conductive bumps over the first contact pad of the chip.

8 Claims, 3 Drawing Sheets

WIRE BONDING PROCESS AND WIRE BOND STRUCTURE

CROSS-REFERENCE TO RELATED APPLICATION

This application claims the priority benefit of Taiwan application serial no. 89127630, filed Dec. 22, 2000.

BACKGROUND OF THE INVENTION

1. Field of the Invention

The invention relates to a wire bonding process and a wire-bonding structure. More particularly, the invention relates to a wire-bonding process performed according to reverse bonding fashion.

2. Description of the Related Art

As the era of information technology progresses, the transmission and processing of information and documents are extensively carried out through electronic equipment. Accompanying the progress of technology, many electronic products with more convenient features are promoted with great success, as mobile phones, computers, audio-video articles, etc. Electronic products usually comprise semiconductor devices packaged into electronic packages. An important step in semiconductor device packaging process is the wire bonding that establishes the electrical connection within the electronic package between the semiconductor device and the carrier of the semiconductor device.

Referring to FIG. 1 and FIG. 2, cross-sectional views schematically illustrate the conventional reverse bonding process disclosed in U.S. Pat. No. 5,328,079 issued to Mathew et al. In FIG. 1, the conventional wire-bonding process comprises first, providing a chip 100. The chip 100 has an active surface 102 and a corresponding back surface 104, wherein the active surface 102 further includes at least a first contact pad 106. A substrate 150 is further provided with a surface 152 on which at least a second contact pad 154 is formed, wherein the back surface 104 of the chip 100 is bonded to, for example, the surface 152 of the substrate 150. By means of a wire-bonding machine (not shown), a conductive bump 108 is formed on the first contact pad 106 of the chip 100.

Referring to FIG. 2, a reverse bonding then is performed using the wire-bonding machine. First, a prominence 182 is formed on the second contact pad 154 in ball-bonding fashion. A head of the wire bonding machine (not shown) then moves from the formed prominence 182 to the conductive bump 108 on the first contact pad 106 of the chip 100, wherein the head of the wire-bonding machine continuously releases a conductive material forming a wire 180 while moving. The wire 180 hence formed is bonded to the conductive bump 108 in a stitch-bonding fashion.

In the foregoing wire bonding process, because the conventionally fixed height of the bump 108 is not sufficient, a shorting contact of the wire 180 with the edge of the chip 100 may occur at the location 190 proximate to the edge of the chip 100. As a result, the reliability of the electronic packaging structure is reduced. Moreover, the wire 180 may easily peel off from the bump 108 when the packaging structure is submitted to a contingent external force.

SUMMARY OF THE INVENTION

An aspect of the invention therefore is to provide a wire-bonding process and a wire-bonding structure that can improve the quality of the electrical connection through bonding-wires, which thus improves the reliability of packaging structures.

Another aspect of the present invention is to provide a wire-bonding process and a wire-bonding structure that ensures the wire bonding.

To attain at least the foregoing objectives, the present invention proposes a wire-bonding process that comprises the following steps. A chip is provided with at least a first contact pad thereon. A chip carrier is further provided with at least a second contact pad thereon. A plurality of stacked conductive bumps are formed over the first contact pad of the chip. A conductive wire is formed such that it connects the second contact pad of the chip carrier to the stacked conductive bumps over the first contact pad of the chip. The formed conductive wire connects the second contact pad via a prominence and the first contact pad on the uppermost conductive bump of the stacked bumps.

To attain at least the foregoing objectives, the present invention proposes a wire bonding process that, according to another embodiment, comprises the following steps. A chip is provided with at least a first contact pad thereon. A chip carrier is further provided with at least a second contact pad thereon. A first conductive bump is formed on the first contact pad of the chip. A conductive wire is formed such that the conductive wire connects the second contact pad of the chip carrier and connects onto the first conductive bump over the first contact pad of the chip. The formed conductive wire connects the second contact pad via a prominence. A second conductive bump is formed on the conductive wire and over the first conductive bump.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting.

Figure 1:
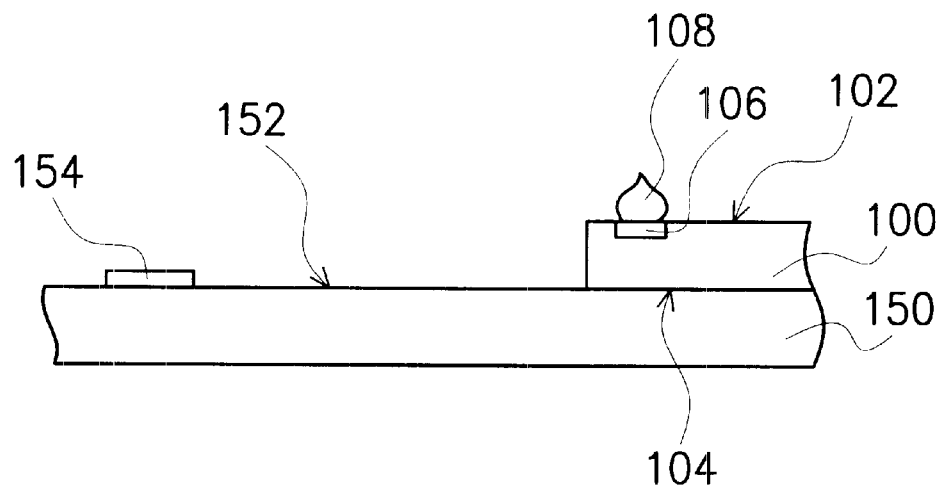
FIG. 1 and FIG. 2 are cross-sectional views schematically illustrating a conventional wire-bonding process.
Figure 2:
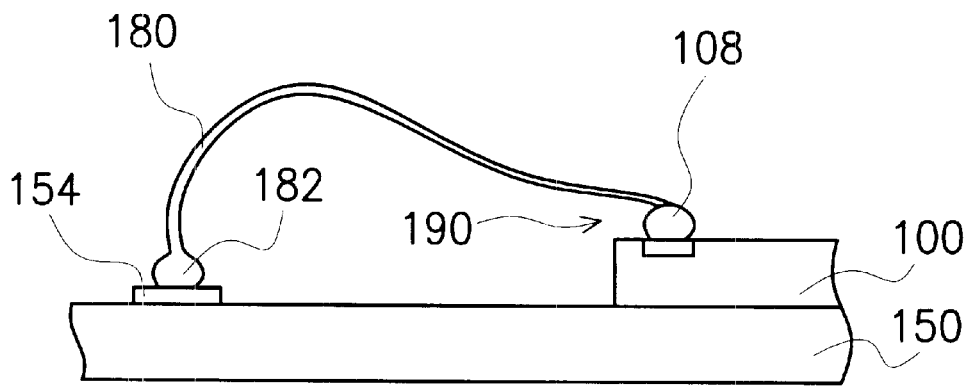
Figure 3:
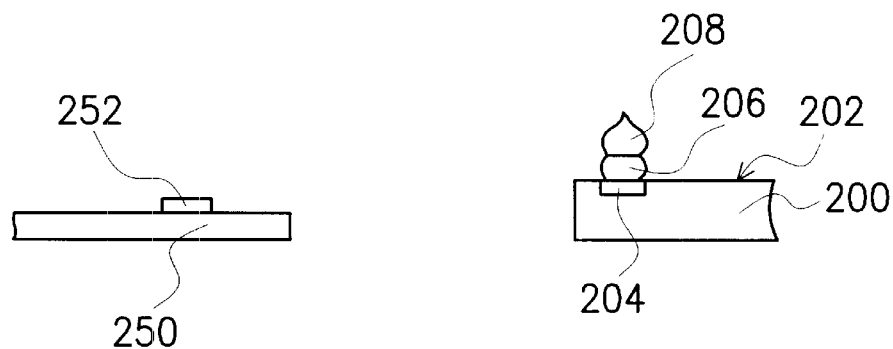
FIG. 3 and FIG. 4 are cross-sectional views schematically illustrating a wire-bonding process according to a first embodiment of the present invention.
Figure 4:
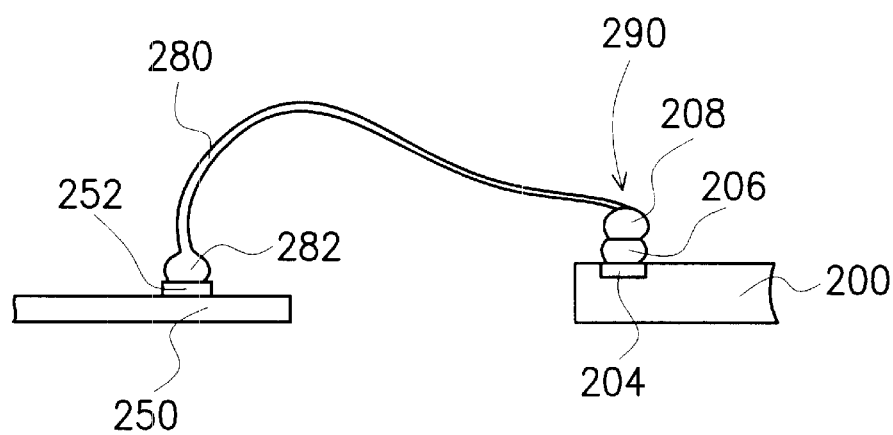

Referring to FIG. 3 and FIG. 4, cross-sectional views schematically illustrate a wire-bonding process according to a first embodiment of the present invention.

With reference to FIG. 3, a chip 200 is provided with an active surface 202 on which are formed at least a first contact pad 204. A chip carrier 250 further includes at least a second contact pad 252 thereon. A plurality of stacked bumps (206, 208) are formed on the first contact pad 204 through, for example, up-down movements of a wire-bonding machine head releasing the conductive material that forms the bumps. In the present description, reference numeral 206 refers to the bump that is formed on the contact pad 204 and reference numeral 208 refers to the uppermost bump.

Referring to FIG. 4, a reverse bonding process is performed as described hereafter. First, a prominence 282 is formed on the second contact pad 252 of the chip carrier 250 in ball-bonding fashion. Then, while moving from the second contact pad 252 to the stacked bumps (206, 208), the head of the wire bonding machine continuously releases a conductive material to form a conductive wire 280 hence bonded to the second bump 208 in stitch-bonding fashion. In the present embodiment of the invention, the conductive wire 280, the first bump 206 and the second bump 208 are made of conductive material such as aluminum or gold, for example.

By forming the stacked bumps (206, 208) in the above reverse bonding process, the wire-bonding location 290 on the stacked bumps (206, 208) thus can be substantially higher on the chip 200. As a result, a sufficient distance separates the conductive wire 280 from the active surface 202 of the chip 200, and shorting contact between the conductive wire 280 and the active surface 202 of the chip 200 can be prevented. The reliability of the electrical connection consequently is improved.

Figure 5:
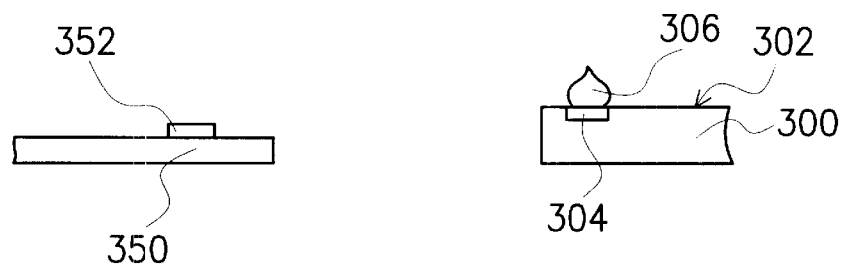
FIG. 5 and FIG. 6 are cross-sectional views schematically illustrating a wire-bonding process according to a second embodiment of the present invention.
Figure 6:
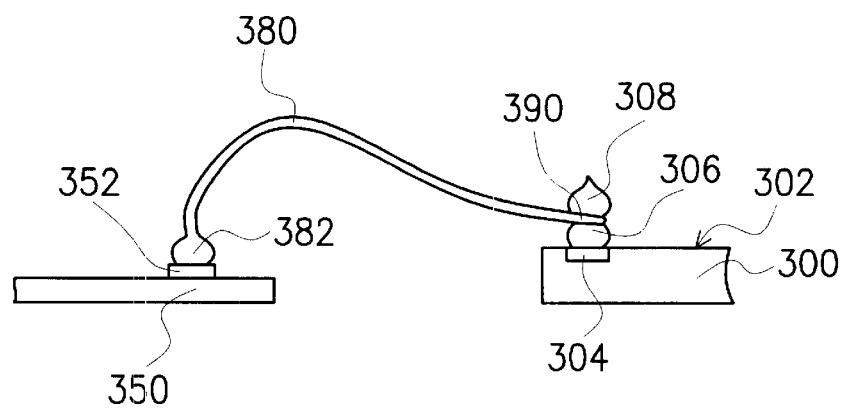

Referring now to FIG. 5 and FIG. 6, cross-sectional views schematically illustrate a wire-bonding process according to second embodiment of the present invention.

Referring to FIG. 5, a chip 300 is provided with an active surface 302 on which at least a first contact pad 304 is formed. A chip carrier 350 is further provided with at least a second contact pad 352 thereon. A first bump 306 is formed on the first contact pad 304 by way of, for example, vertical up and down movements of a wire-bonding machine head releasing a conductive material to form the bump.

Referring to FIG. 6, a reverse bonding process is performed as follows. First, a prominence 382 is formed on the second contact pad 352 of the chip carrier 350 in ball-bonding fashion. Then, while moving from the second contact pad 352 to the first bump 306, the wire-bonding machine head continuously releases a conductive material to form a conductive wire 380 hence bonded to the first bump 306 in stitch-bonding fashion. A second bump 308 then is formed on the conductive wire 380 and over the first bump 306 by, for example, a process identical to that for forming the first bump 306. The conductive wire 380, the first bump 306 and the second bump 308 are made of conductive material such as aluminum or gold, for example.

By performing the above wire-bonding process in which the conductive wire 380 is clamped between the first bump 306 and the second bump 308, the bonding location 390 of the conductive wire 380 hence can be firmly maintained between the bumps (306, 308).

In conclusion, the foregoing description of the embodiments of the present invention reveals at least the following advantages. By up setting the bonding location of the conductive wire on the active surface of the chip by means of stacked bumps, a shorting contact of the wire with the active surface of the chip thus can be prevented. On the other hand, by clamping the bonding location of the conductive wire between two bumps over the active surface of the chip, the bonding of the wire to the chip hence can be ensured and peeling off of the conductive wire can be prevented.

It will be apparent to those skilled in the art that various modifications and variations can be made to the structure of the present invention without departing from the scope or spirit of the invention. For example, a combination of the two wire-bonding arrangements described above is applicable to improve the reliability of the wire-bonding process. In view of the foregoing, it is intended that the present invention cover modifications and variations of this invention provided they fall within the scope of the following claims and their equivalents.

What is claimed is:

1. A wire-bonding process comprising:

providing a chip having at least a first contact pad;

providing a chip carrier having at least a second contact pad;

forming a first conductive bump over the first contact pad;

forming a conductive wire electrically connecting the second contact pad of the chip carrier to the first conductive bump; and forming a second conductive bump on the wire and over the first conductive bump.

2. The process of claim 1, wherein the conductive wire connects the second contact pad of the chip carrier via a prominence formed on the second contact pad, and the conductive wire connects onto the first conductive bump in a stitch-bonding fashion.

3. The process of claim 1, wherein the conductive wire, the first conductive bump, and the second conductive bump are made of aluminum.

4. The process of claim 1, wherein the conductive wire, the first conductive bump, and the second conductive bump are made of gold.

5. A wire-bonding structure comprising:

a chip having at least a first contact pad;

a pair of conductive bumps located over the first contact pad;

a carrier having at least a second contact pad; and a conductive wire electrically connecting the second contact pad of the chip carrier to the conductive bumps over the first contact pad of the chip, wherein the contact of the conductive wire with the conductive bumps is located between the conductive bumps.

6. The wire-bonding structure of claim 5, wherein the conductive wire connects the second contact pad of the chip carrier via a prominence formed on the second contact pad, and the conductive wire connects between the conductive bumps in a stitch-bonding fashion.

7. The wire-bonding structure of claim 5, wherein the conductive wire and the conductive bumps are made of aluminum.

8. The wire-bonding structure of claim 5, wherein the conductive wire and the conductive bumps are made of gold.

* * * * *